(12) United States Patent
Fukushima et al.

(10) Patent No.: US 8,772,631 B2
(45) Date of Patent: Jul. 8, 2014

(54) SOLAR CELL

(71) Applicant: Taiyo Yuden Co., LTD., Tokyo (JP)

(72) Inventors: Takeyuki Fukushima, Tokyo (JP); Kenichi Ota, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/632,409

(22) Filed: Oct. 1, 2012

(65) Prior Publication Data

US 2013/0139879 A1 Jun. 6, 2013

(30) Foreign Application Priority Data

Sep. 30, 2011 (JP) .................................. 2011-216948

(51) Int. Cl.
*H01L 31/0224* (2006.01)

(52) U.S. Cl.
USPC .......................................... 136/256; 136/259

(58) Field of Classification Search
CPC . H01G 9/2068; H01G 9/2077; H01G 9/2081; H01G 9/20; H01G 9/04; H01G 9/008; H01L 31/02013
USPC ......................................................... 136/256
See application file for complete search history.

(56) References Cited

U.S. PATENT DOCUMENTS

2011/0088772 A1* 4/2011 Usui .............................. 136/256
2012/0180850 A1* 7/2012 Kim et al. ...................... 136/251

FOREIGN PATENT DOCUMENTS

| JP | 2002094087 | * | 3/2002 | ............. H01L 31/04 |
| JP | 2005-222995 | | 8/2005 | |
| JP | 2010-211971 | | 9/2010 | |

* cited by examiner

*Primary Examiner* — Jonathan Johnson
*Assistant Examiner* — Bethany Lambright
(74) *Attorney, Agent, or Firm* — Pillsbury Winthrop Shaw Pittman, LLP

(57) ABSTRACT

A solar cell with an electrode lead-out structure that a unitary cell to be easily mounted on and removed from a connection side substrate is provided. A solar cell has a power generation electrode including a transparent electrode, a collector electrode, and a power generation layer formed on a translucent substrate and is arranged opposite an opposite electrode so that the power generation layer is sandwiched between the power generation electrode and the opposite electrode. A through-hole is formed in a substantially central portion of the translucent substrate. Another through-hole is formed in another substrate and its periphery forms an annular exposed portion that does not overlap the opposite electrode. A lead-out portion for the collector electrode is formed on the exposed portion. Metal thin films are connected together to form lead-out portions. Thus, a positive electrode and a negative electrode are led out in the same direction.

9 Claims, 3 Drawing Sheets

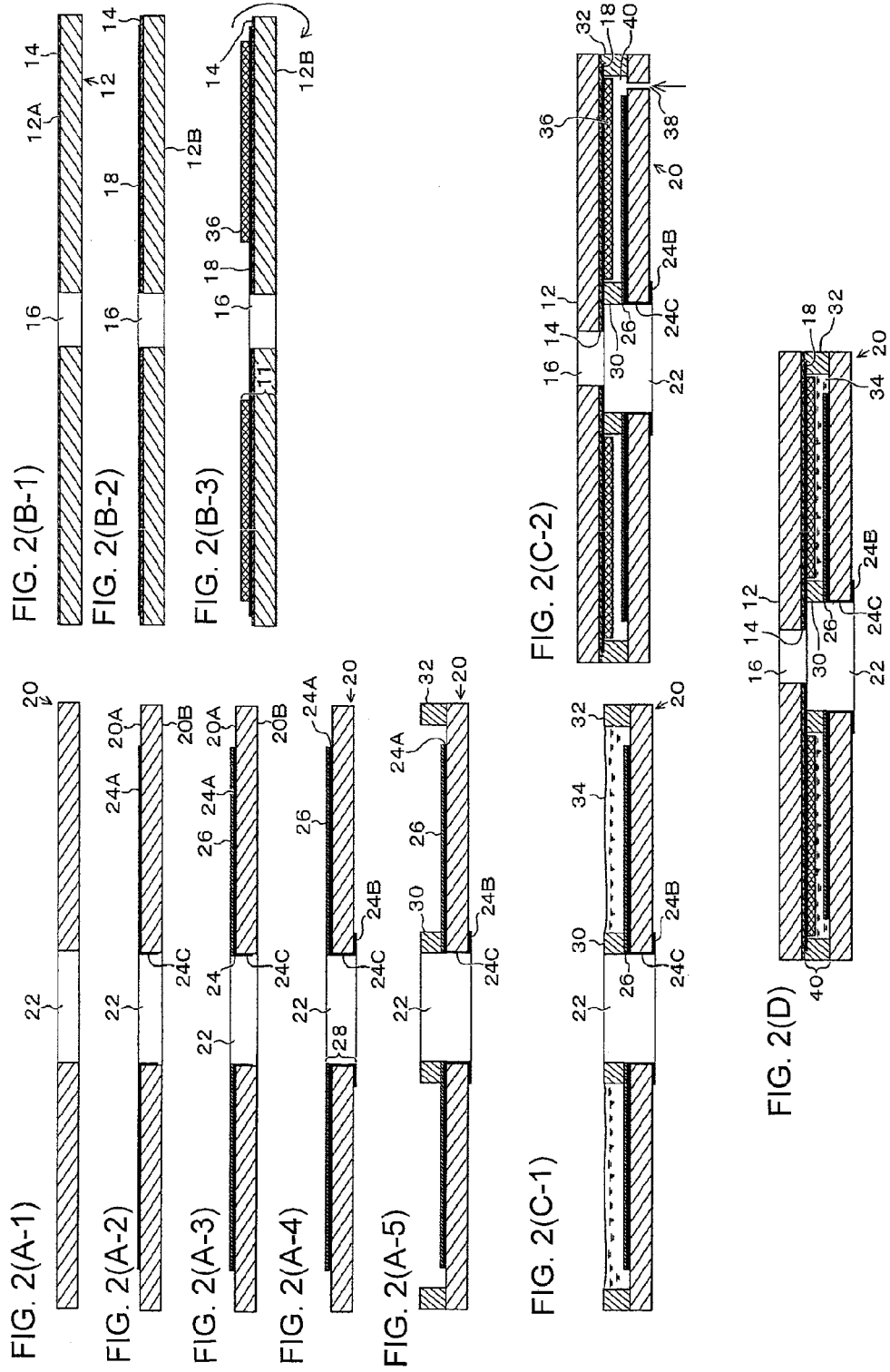

SOLAR CELL

BACKGROUND OF THE INVENTION

1. Field of the Invention

The present invention relates to a solar cell, and more specifically, to the structure of a lead-out electrode. This application claims the benefit of priority from Japanese Patent Application No. 2011-216948, filed Sep. 30, 2011, the content of which is incorporated herein by reference in its entirety.

2. Description of the Related Art

Solar cells are roughly classified into silicon-based cells, compound-based cells, and organic cells according to a material for a light absorbing layer (power generation layer). Among these solar cells, dye-sensitized solar cells (hereinafter referred to as "DSCs") include a power generation electrode (negative electrode) in which a semiconductor layer (for example, $TiO_2$) carrying a sensitizing dye is formed, an opposite electrode (positive electrode) with catalyst metal formed therein, and an electrolyte sandwiched between the power generation electrode and the opposite electrode and containing iodine redox (see, for example, FIG. 13 of Japanese Patent Laid-Open No. 2010-211971 shown below). A power generation mechanism of the DSC acts according to the following cycle (1) to (4).

(1) When solar light enters a light receiving surface, electrons are excited in the dye due to absorption of energy.
(2) The excited electrons migrate to the $TiO_2$, which forms the semiconductor layer, further pass through a transparent electrode to the outside (on the negative electrode side).
(3) The dye having lost the electrons draws electrons from the electrolyte.
(4) The electrolyte having lost the electrons to the dye takes electrons from the positive electrode.

Advantageously, the above-described dye-sensitized solar cell depends on the angle of incident light less significantly than the conventional solar cells (silicon-based cells, compound-based cells, and the like) and can generate power even with weak light such as indoor light. In connection not only with the dye-sensitized solar cell but also with all the other solar cells, a practical solar cell panel is supplied with power by a plurality of solar cells connected together in series-parallel. In this case, even if only some of the solar cells are degraded, the characteristics of the whole panel are significantly deteriorated. Thus, the ability to exclusively replace the degraded solar cells is advantageous for maintaining the characteristics of the whole panel.

Japanese Patent Laid-Open No. 2010-211971 shown below discloses a dye-sensitized solar cell including a first substrate with a first thin-film electrode, a second substrate with a second thin-film electrode, a semiconductor layer which contacts one of the first thin-film electrode and the second thin-film electrode and on which a dye is adsorbed, an insulating spacer disposed between the first thin-film electrode and the second thin-film electrode arranged opposite each other, and an electrolyte filled in a space enclosed by the first thin-film electrode, the second thin-film electrode, and the insulating spacer, wherein a substrate for a positive electrode is processed so as to form processed holes (through-holes) therein so that lead-out electrodes are oriented in the same direction so as to be easily led out. Furthermore, Japanese Patent Laid-Open No. 2005-222995 shown below discloses that two electrodes of a dye-sensitized solar cell are led out in the form of plugs and that a connection substrate side for modularization is shaped like a socket, thus improving the connectivity of the unitary cell. This enables a user to select the number and sequence of mounted units according to the user's need.

LIST OF RELEVANT PATENT LITERATURES

Japanese Patent Laid-Open No. 2010-211971
Japanese Patent Laid-Open No. 2005-222995

However, according to Japanese Patent Laid-Open No. 2010-211971 described above, the positive electrode substrate is processed to expose a metal electrode, and the resulting processed holes are filled with conductive paste or the like so that the electrodes can be led out in the same direction. Thus, for example, the adhesion of the conductive paste to the electrode needs to be taken into account. This is disadvantageous in terms of reliability; the electrode may be peeled off during cycle tests. Furthermore, the structure in Japanese Patent Laid-Open No. 2005-222995 described above disadvantageously involves a complicated installation-side structure.

Moreover, the conventional silicon- and compound-based solar cells have another disadvantage. For example, if such solar cells are applied to an on-the-roof panel, once the solar cells are mounted on the connection substrate side, the whole panel in this structure needs to be replaced even when only some of the solar cells are degraded. Consequently, replacing the unitary cells is disadvantageously difficult. Thus, disadvantageously, although only some of the solar cells are degraded, the whole panel needs to be shut down, thus reducing integrated power generation time due to the amount of time until the solar cells are replaced. As a result, the utilization efficiency (or operating rate) of the solar power generation system decreases. It is thus advantageous to be able to provide a connection structure which allows solar cells to be easily mounted on and removed from the connection substrate side and replaced and which enables some of the solar cells to be exclusively easily replaced when the solar cells are incorporated into a panel.

In view of the above-described points, an object of the present invention is to provide a solar cell with an electrode lead-out structure that is easily mounted on and removed from the connection electrode.

SUMMARY OF THE INVENTION

The present invention provides a solar cell including a power generation layer arranged between a first electrode and a second electrode, at least one of the first and second electrodes being translucent, characterized in that a first through-hole penetrating the first electrode is formed, a second through-hole which is different from the first through-hole in size and which penetrates the second electrode is formed at a position corresponding to the first through-hole, a periphery of the first or second through-hole is exposed without overlapping the power generation layer, a first electrode lead-out terminal is provided around the first through-hole to allow the first electrode to be led out, and a second electrode lead-out terminal is provided around the second through-hole to allow the second electrode to be led out in a direction identical to a direction in which the first electrode is led out.

A main aspect is characterized in that the first electrode that is translucent is formed on one principal surface of a translucent first substrate, the second through-hole is larger than the first through-hole and a periphery of the first through-hole is exposed without overlapping the power generation layer, the second electrode is formed on one principal surface of a second substrate with a through-hole formed at a position corresponding to the second through-hole, and the second electrode lead-out terminal is formed on another principal surface of the second substrate and is connected to the second electrode through an inner wall surface of the through-hole in the second substrate.

Another aspect is characterized in that a sealant is arranged between the first substrate and the second substrate on an outer peripheral side and on an inner peripheral side of each of the substrates, an electrolyte is sealed in a space formed by the sealant and the first and second substrates, and the power generation layer is a porous semiconductor layer contacting the first electrode in the space and carrying a dye on a surface thereof and is a dye-sensitized photovoltaic power generation layer.

Yet another aspect is characterized in that the second electrode lead-out terminal is a conductor thin film formed at least around the through-hole in the second substrate at another principal surface side of the second substrate, and connects to the second electrode via a conductor thin film covering the inner wall surface of the through-hole in the second substrate. Alternatively, the aspect is characterized in that a collector electrode is formed on the first electrode, and the collector electrode includes an annular portion formed in an exposed portion around the first through-hole and forming the first electrode lead-out terminal and radial portions formed to extend radially from the annular portion to an outer edge of the collector electrode. The above-described and other objects, features, and advantages of the present invention will be apparent from the following detailed description and attached drawings.

According to the present invention, in the solar cell including the power generation layer arranged between the first electrode and the second electrode, at least one of the first and second electrodes being translucent, the first through-hole penetrating the first electrode is formed, the second through-hole which is different from the first through-hole in size and which penetrates the second electrode is formed at the position corresponding to the first through-hole, the periphery of the first or second through-hole is exposed without overlapping the power generation layer, the first electrode lead-out terminal is provided around the first through-hole to allow the first electrode to be led out, and the second electrode lead-out terminal is provided around the second through-hole to allow the second electrode to be led out in the direction identical to the direction in which the first electrode is led out. Thus, the first and second electrodes can be led out in the same direction utilizing the second through-hole, facilitating the solar cell to be easily mounted on and removed from the connection substrate or the like.

BRIEF DESCRIPTION OF THE DRAWINGS

FIG. 2(A-1) shows substrate 20 which includes the generally circular through-hole 22 formed in a substantial center thereof.

FIG. 2(A-2) shows a metal thin film 24A forming the metal electrode (positive electrode) 24 is formed on the substrate principal surface 20A side except for the outer peripheral portion thereof.

FIG. 2(A-3) shows a catalyst layer 26 was formed on the metal thin film 24A by sputtering.

FIG. 2(A-4) shows the metal thin film 24C formed in a part of the through-hole 22 as a result of a step shown in FIG. 2(A-2) is connected to the metal thin film having entered the through-hole 22 as a result of the present step.

FIG. 2(A-5) shows a cell sequentially produced.

FIG. 2(B-1) shows a substrate 12 which includes the generally circular through-hole 16 formed in a substantial center thereof.

FIG. 2(B-2) shows a collector electrode 18 of thickness 1 μm was formed on the principal surface 12A of the substrate 12 by sputtering Ti.

FIG. 2(B-3) shows a power generation layer 36 on collector electrode 18 of substrate 12.

FIG. 2(C-1) shows the electrolyte 34 filled into the space formed by the sealants 30 and 32 and substrate 20.

FIG. 2(C-2) shows power generation electrode 11 and the opposite electrode 28 combined together via the sealants 30 and 32.

FIG. 2(D) shows power generation electrode 11 produced during the step in FIG. 2(B-3) turned upside down and laminated on the substrate 20 to obtain the solar cell 10.

REFERENCE SIGNS LIST

Figure 1B:
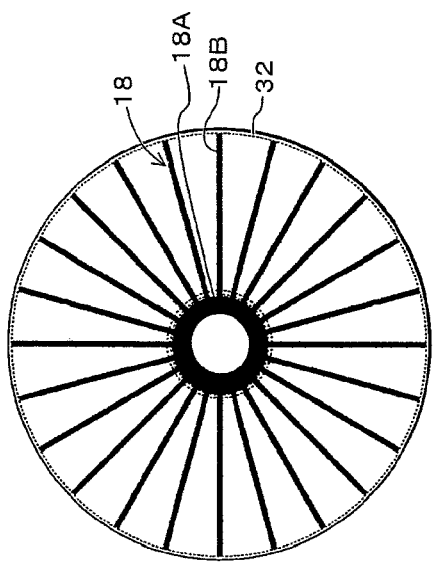
FIG. 1(B) is a plan view showing the shape of a collector electrode.

10: Solar cell
11: Power generation electrode
12: Substrate
12A, 12B: Principal surface
14: Transparent electrode
16: Through-hole
16A: Peripheral portion
18: Collector electrode
18A: Annular portion
18B: Radial portion
20: Substrate
20A, 20B: Principal surfaces
22: Through-hole
24: Metal electrode (positive electrode)
24A to 24C: Metal thin films
26: Catalyst layer (Pt thin film)
28: Opposite electrode
30, 32: Sealants (spacers)
34: Electrolyte
36: Power generation layer (dye-carrying $TiO_2$ layer)
38: Hole
40: Space
42, 44: Electrode lead-out portions
50: Solar cell
52: Glass substrate
54: Through-hole
56: Transparent electrode
56A: Exposed portion
58: Metal electrode
60: Through-hole
62: Power generation layer
64: Insulating layer
66, 68: Electrode lead-out portions
70, 80: Solar cells 72, 82: Substrates
74, 76, 84, 86: Through-holes

DETAILED DESCRIPTION OF THE PREFERRED EMBODIMENTS

Embodiments of the present invention will be described in detail below.

[Embodiment 1]

Figure 1A:
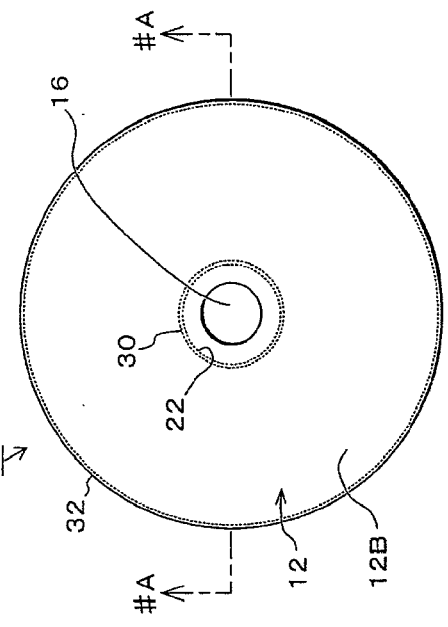
FIG. 1(A) is a plan view diagram showing a dye-sensitized solar cell according to Embodiment 1 of the present invention.
Figure 1C:
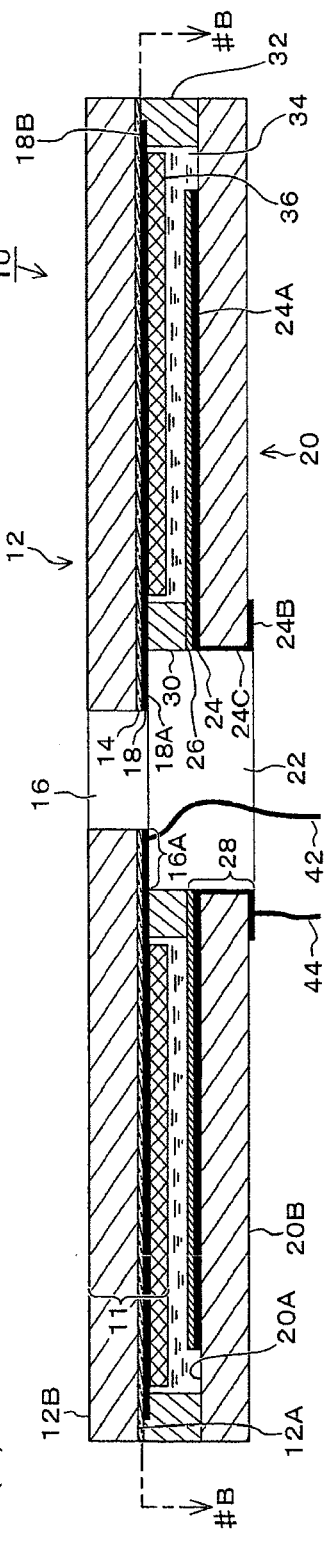
FIG. 1(C) is a cross-sectional view taken along line #A-#A in FIG. 1(A) and showing the solar cell as seen in the direction of an arrow.

First, Embodiment 1 of the present invention will be described with reference to FIGS. 1(A)-1(C) and FIGS. 2(A-1)-2(D). The present embodiment is an example in which the present invention is applied to a dye-sensitized solar cell using a dye-sensitized photovoltaic power generation layer. FIG. 1(A) is a plan view of the solar cell according to the present embodiment. FIG. 1(B) is a plan view showing the electrode shape of a collector electrode. FIG. 1(C) is a cross-sectional view taken along line #A-#A in FIG. 1(A) and showing the solar cell as seen in the direction of an arrow. In FIG. 1(A), if a substrate is translucent as described below, the shape of a collector electrode arranged below the substrate (a side of the sheet of FIG. 1 which is far from the reader) may be seen through. However, the electrode shape of the collector electrode is not shown in FIG. 1(A) but in FIG. 1(B). Furthermore, FIG. 1(B) corresponds to a plane taken along line #B-#B in FIG. 1(C) and in which the substrate is viewed in the direction of an arrow. FIGS. 2(A-1)-2(D) are different views of diagrams showing an example of a process of manufacturing a solar cell according to the present invention.

As shown in FIG. 1(C), a solar cell 10 according to the present embodiment includes a power generation electrode 11 and an opposite electrode 28 arranged opposite each other. The power generation electrode 11 includes a substrate 12 on a negative electrode side, a transparent electrode 14 on a negative electrode side, a corrector electrode 18, and a power generation layer 36. The substrate 12 is generally circular and translucent and includes a generally circular through-hole 16 formed in a substantially central portion. A given range of the periphery of the through-hole 16 is exposed without overlapping the power generation layer 36 and the opposite electrode 28, as shown in FIG. 1(C). Furthermore, a transparent electrode 14 is formed all over one principal surface 12A of the substrate 12 except for the through-hole 16. Moreover, a collector electrode 18 is formed on the transparent electrode 14. The collector electrode 18 is adapted to efficiently collect electrons generated from a dye described below, on an external lead-out electrode. The collector electrode 18 is shaped to allow light to pass through so that light transmitted through the substrate 12 and the transparent electrode 14 is not prevented from entering the power generation layer 36. According to the present embodiment, as shown in FIG. 1(B), the collector electrode 18 includes an annular portion 18A formed in a peripheral portion 16A of the through-hole 16 and radial portions 18B formed to extend radially from the annular portion 18A to an outer edge of the collector electrode 18. The annular portion 18A is utilized as an electrode lead-out terminal on the negative electrode side. As the substrate 12 and the transparent electrode 14, for example, a plastic substrate with a transparent electrode formed of ITO or the like is utilized. For example, a Ti thin film is used as the collector electrode 18.

The opposite electrode 28 includes a substrate 20, a metal electrode 24 on the positive electrode side, and a catalyst layer 26. The substrate 20 is generally circular and includes a generally circular through-hole 22 in a substantially central portion. The through-hole 22 is formed to have a larger diameter than a through-hole 16 in the substrate 12. That is, when the power generation electrode 11 and the opposite electrode 28 are placed opposite each other, a peripheral portion 16A of the through-hole 16 is exposed. The annular portion 18A of the collector electrode 18 is formed on the exposed portion so that the annular portion 18A can be utilized as an electrode lead-out terminal. A metal thin film 24A forming a part of the metal electrode 24 and a catalyst layer 26 with a catalytic function are provided on one principal surface 20A of the substrate 20 except for the through-hole 22 and a predetermined width portion of the outer edge. The catalyst layer 26 is adapted to facilitate delivery of electrons to iodide ions in an electrolyte 34 described below. The metal thin film 24A is electrically connected to a metal thin film 24B formed on the other principal surface 20B side around the through-hole 22, by a metal thin film 24C covering an inner wall surface of the through-hole 22. That is, according to the present embodiment, the metal thin film 24B on the principal surface 20B is utilized as an electrode lead-out terminal on the positive electrode side. The use of the through-hole 22 as described above allows the electrode on the power generation electrode 11 side and the electrode on the opposite electrode 28 side to be led out in the same direction. This allows the solar cell to be easily mounted on and removed from a connection substrate or the like (not shown in the drawings). The substrate 20 is, for example, a plastic substrate, and the metal electrode 24 is formed of a Ti thin film or the like similarly to the collector electrode 18. Furthermore, the catalyst layer 26 is, for example, a Pt thin film or a carbon film.

An insulating sealant (or spacer) 30 and an insulating sealant (or spacer) 32 are arranged between the power generation electrode 11 and the opposite electrode 28; the sealant 30 is provided along the periphery of the through-hole 22, and the sealant 32 is provided along the outer periphery of each of the substrates 12 and 20. An electrolyte 34 is sealed in a space 40 (see FIG. 2(C-2)) formed by the sealants 30 and 32 and the substrates 12 and 20. A power generation layer 36 formed of a porous semiconductor including a dye carried on a surface thereof is provided in the electrolyte 34 in contact with the transparent electrode 14 and the collector electrode 18. That is, the power generation layer 36 is arranged between the metal electrode 24 on the positive electrode side and the transparent electrode 14 and collector electrode 18 on the negative electrode side. Such a configuration of a dye-sensitized photovoltaic power generation layer is well known. For example, the electrolyte 34 used contains iodine redox, and the power generation layer 36 is, for example, $TiO_2$. The solar cell 10 configured as described above enables both the positive and negative electrodes to be led out in the same direction using an electrode lead-out portion 42 conductively connected to the annular portion 18A of the collector electrode 18 on the power generation electrode 11 side through the through-hole 22 and an electrode lead-out portion 44 conductively connected to the metal thin film 24B on the opposite electrode 28 side as shown in FIG. 1(C).

Now, an example of a method for manufacturing a solar cell 10 according to the present embodiment will be described also with reference to FIGS. 2(A-1)-2(D). First, production of the opposite electrode 28 side will be described. As shown in FIG. 2(A-1), the substrate 20 is prepared which includes the generally circular through-hole 22 formed in a substantial center thereof. The substrate 20 was a PEN (polyethylene naphthalate) film with an outer diameter of 120 mm. The through-hole 22 was 25 mm in diameter. Then, a metal thin film 24A forming the metal electrode (positive electrode) 24 is formed on the substrate principal surface 20A side except for the outer peripheral portion thereof (see FIG. 2(A-2)). At this time, film formation conditions are set such that the metal thin film enters the through-hole 22 to cover a part of the inner wall so as to connect to a metal thin film 24B on the other principal surface 20B side which is to be subsequently formed (see the metal thin film 24C in FIG. 2(A-2)). According to the present embodiment, the conductor thin film 24A of thickness 1 µm was produced by sputtering. Then, a catalyst layer 26 was formed on the metal thin film 24A by sputtering (see FIG. 2(A-3)). According to the present embodiment, a Pt thin film of thickness 50 nm was produced as the catalyst layer 26.

After the Ti thin film 24A and the Pt catalyst layer 26 are formed on the substrate principal surface 20A, the substrate 20A was turned upside down, and a metal thin film 24B of thickness 0.5 µm was formed in the peripheral portion of the through-hole 22 in the other principal surface 20B under the same film formation conditions as those for the metal thin film 24A. At this time, since the film formation conditions are set so that a part of the metal thin film enters the through-hole 22, the metal thin film 24C formed in a part of the through-hole 22 as a result of a step shown in FIG. 2(A-2) is connected to the metal thin film having entered the through-hole 22 as a result of the present step shown in FIG. 2(A-4). Thus, the metal thin film 24C covers the entire inner wall surface of the through-hole 22. That is, the metal electrode 24 is electrically connected between the principal surfaces 20A and 20B of the substrate 20 via the metal thin film 24C on the inner wall surface of the through-hole 22. The metal thin film 24B need not be provided all over the principal surface 20B but may be provided around the through-hole 22 so as to have an outer diameter of about 35 mm. When a tester was used to check for electric connection between the front surface and the back surface, sheet resistance measured 5 Ω/□ on the principal surface 20A side, 15 Ω/□ on the principal surface 20B side, and 20 Ω/□ at the connection between the principal surface 20A and the principal surface 20B (the inner wall surface portion of the through-hole 22).

Now, production of the power generation electrode 11 side will be described. As shown in FIG. 2(B-1), the substrate 12 is prepared which includes the generally circular through-hole 16 formed in a substantial center thereof and the transparent electrode 14 made of ITO or the like and formed on the principal surface 12A side. The substrate 12 used was a PEN film having the thickness of 125 µm with an ITO (transparent electrode) of outer diameter 120 mm. The through-hole 16 was set to be smaller than the through-hole 22 in diameter so as to prevent the peripheral portion 16A from overlapping the opposite electrode 28 side when the substrate 12 is laminated on the opposite electrode 28 side. According to the present embodiment, the diameter of the through-hole 16 was set to 15 mm. Then, a collector electrode 18 of thickness 1 µm was formed on the principal surface 12A of the substrate 12 by sputtering Ti as shown in FIG. 2(B-2).

Then, as shown in FIG. 2(B-3), a power generation layer 36 is formed on the collector electrode 18 of the substrate 12. According to the present embodiment, as the power generation layer 36, a $TiO_2$ film of thickness 10 µm was produced by screen printing using nanoporous $TiO_2$ paste. Predetermined surface reforming was carried out in order to increase the film density of the printed $TiO_2$ film. Then, a dye is adsorbed onto the power generation layer 36. According to the present embodiment, for the dye adsorption, a dye solution was used which was prepared by mixing an Ru-based dye N719, acetonitrile, and t-butanol together. Specifically, the $TiO_2$ layer/film substrate was placed in a sample container (not shown in the drawings) and thus immersed in the dye solution, and the dye was adsorbed at room temperature for 20 hours. Thereafter, the power generation layer 36 was determined to adsorb a sufficient amount of dye.

The substrate 12 with the collector electrode 18 and the power generation layer 36 formed thereon as described above is combined with the opposite electrode 28 with the metal electrode 24 during the steps shown in FIG. 2(A-1) to (A-4). A procedure for the combination involves providing the insulating sealant (or spacer) 30 along the inner periphery of the substrate 20 (the edge of the through-hole 22) and providing the insulating sealant (or spacer) 32 along the outer periphery of the substrate 20. Then, as shown in FIG. 2(C-1), the electrolyte 34 is filled into the space formed by the sealants 30 and 32 and the substrate 20. The power generation electrode 11 produced during the step in FIG. 2(B-3) is turned upside down and laminated on the substrate 20 to obtain the solar cell 10 shown in FIG. 2(D). Alternatively, as shown in FIG. 2(C-2), the power generation electrode 11 and the opposite electrode 28 are combined together via the sealants 30 and 32. Then, through a hole 38 for electrolyte injection formed in the substrate 20, the electrolyte 34 is sealed in the space 40 formed by the power generation electrode 11, the opposite electrode 28, and the sealants 30 and 32. The hole 38 is then sealed with resin to obtain the solar cell 10 shown in FIG. 2(D).

Various well-known methods are available for joining the substrate 12 and the substrate 20 together. For example, if a cell is sequentially produced as shown in FIG. 2(A-5), FIG. 2(C-2), and FIG. 2(D) in this order, the following method is used. A thermoplastic resin (which corresponds to the sealants 30 and 32) was placed on the outer periphery and inner periphery of the substrate 20. Then, the substrate 12 was brought into abutting contact with the substrate 20 so that the collector electrode 18 and the metal electrode 24 lied opposite each other. A thermocompression bonding apparatus was used to heat and compress the substrates at 150° C. or lower to bind the substrates together, thus sealing the entire surfaces of the substrates. The thus produced solar cell 10 enables the electrodes to be led out in the same direction by, for example, on the negative electrode side, connecting the electrode lead-out portion 42 to the annular portion 18A of the collector electrode 18 while on the positive electrode side, connecting the electrode lead-out portion 44 to the metal thin film 24B, as shown in FIG. 1(C).

Thus, Embodiment 1 exerts the following effects.

(1) In the solar cell 10 including the power generation layer 36 arranged between the transparent electrode 14 and collector electrode 18 formed on the principal surface 12A of the translucent substrate 12 and the metal electrode 24 formed on the principal surface 20A of the substrate 20, the through-hole 22 larger than the through-hole 16 formed in the substrate 12 is formed in the substrate 20. Then, the metal electrode 24 is connected between the front surface and back surface of the substrate 20 through the inner wall surface of the through-hole 22. Thus, both the negative electrode and the positive electrode can be led out in the same direction. This also allows the solar cell 10 to be easily mounted on and removed from the connection substrate or the like.

(2) The generally circular shape of the solar cell 10 eliminates the need for orientation of the solar cell 10 to the connection substrate or the like. This significantly improves connectivity. Furthermore, Embodiment 1 eliminates the need for a complicated substrate processing process, enabling simplification of the manufacturing process and cost reduction.

(3) In the substantially central portion of the solar cell 10, the electrode lead-out portion for the positive electrode (metal thin film 24B) is adjacent to the electrode lead-out portion for the negative electrode (annular portion 18A). This allows lead-out positions and power collection after lead-out to be easily designed.

The present invention is not limited to the above-described embodiment. Various changes may be made to the embodiment without departing from the spirits of the present invention. For example, the present invention includes the following.

Figure 3A:
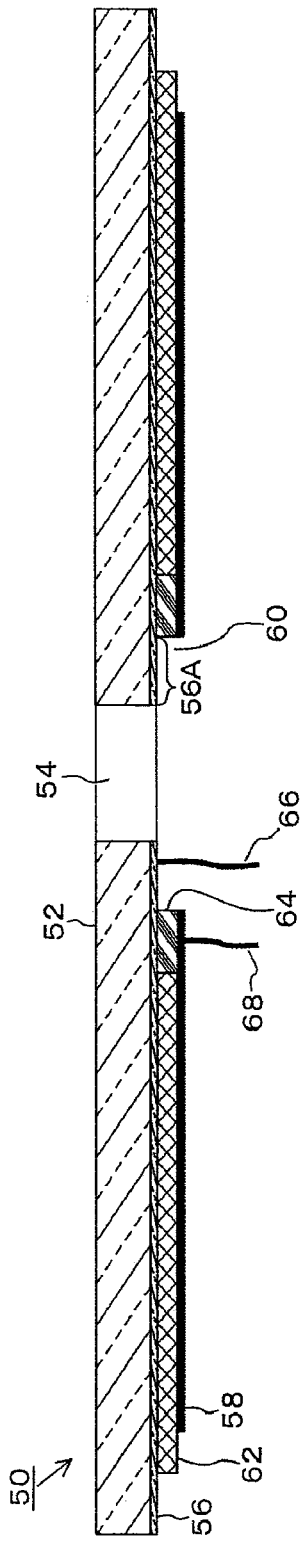
FIG. 3(A) shows a thin film-based solar cell which uses a thin film formed of a-Si, CIGS, or CdTe.

(1) According to Embodiment 1 described above, the present invention is applied to the dye-sensitized solar cell. However, the present invention is applicable to various other well-known solar cells such as silicon-based solar cells and compound-based solar cells provided that the structure includes a power generation layer between a first electrode and a second electrode. For example, a solar cell 50 shown in FIG. 3(A) is a thin film-based solar cell which uses a thin film formed of a-Si, CIGS, or CdTe and which includes a transparent electrode 56 formed on a principal surface of a glass substrate 52, a power generation layer 62 and an insulating layer 64 both formed on the transparent electrode 56, and a metal electrode 58 (second electrode) formed on the power generation layer 62 and the insulating layer 64. The insulating layer 64 is provided on an inner peripheral side of the power generation layer 62. A through-hole 54 is formed in a substantially central portion of each of the glass substrate 52 and the transparent substrate 56. A through-hole 60 having a larger diameter than the through-hole 54 is formed in a substantially central portion of the metal electrode 58. That is, a peripheral portion of the through-hole 54 in the transparent electrode 56 is exposed without overlapping the power generation electrode 62 and the metal electrode 58. The exposed portion 56A is used as an electrode lead-out terminal. An electrode lead-out portion 66 is connected to the exposed portion 56A. Furthermore, an electrode may be led out from any portion of the metal electrode 58, but according to the present embodiment, a peripheral portion of the through-hole 60 is used as an electrode lead-out terminal and connects to an electrode lead-out portion 68. This configuration is similar to Embodiment 1 described above in that the positive electrode and the negative electrode can be led out in the same direction.

Figure 3B:
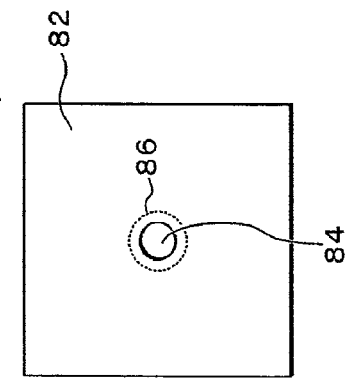
FIG. 3(B) shows both a through-hole 74 in a square substrate and a though-hole 76 in a substrate (not shown in the drawings) arranged opposite the substrate 72 may be square.
Figure 3C:
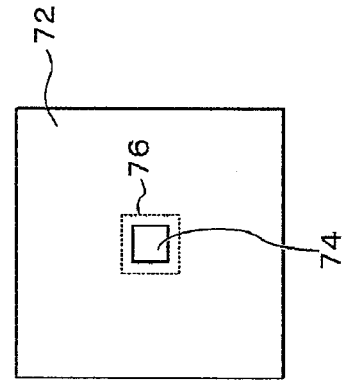
FIG. 3(C) shows a substrate 82 may be square, whereas through-holes 84 and 86 may be circular.

(2) The shapes and dimensions described above in the embodiment are illustrative and may be changed as necessary. For example, according to Embodiment 1 described above, the external shape of the solar cell 10 and the through-holes 16 and 22 are circular. However, this is also illustrative and the external shape of the cell and the shape of the through-holes may be changed as necessary. For example, as in the case of a solar cell 70 shown in FIG. 3(B), both a through-hole 74 formed in a square substrate and a through-hole 76 formed in a substrate (not shown in the drawings) arranged opposite the substrate 72 may be square. Alternatively, as in the case of a solar cell 80 shown in FIG. 3(C), a substrate 82 may be square, whereas through-holes 84 and 86 may be circular. When cells are incorporated into a panel, externally square cells eliminate possible gaps in the panel, allowing power generation efficiency to be improved. On the other hand, circular cells can be mounted independently of the direction in which the cells are mounted. Thus, the shape of the cell and the through-holes may be determined depending on the application.

(3) According to the above-described embodiment, one through-hole is formed in one substrate. However, this is also illustrative and a plurality of through-holes may be formed in one substrate. Furthermore, the position where the through-hole is formed is not limited to the substantially central portion but may be changed as necessary.

(4) The materials disclosed in the embodiment are also illustrative. Various well-known materials may be utilized provided that the materials allow similar effects to be exerted. For example, according to the embodiment, the collector electrode 18 and the metal electrode 24 are Ti thin films. However, this is also illustrative. For example, a well-known metal may be used which is unlikely to react with a dye in an electrolyte, or an electrode may be formed by coating the metal thin film with gold.

(5) The shape of the collector electrode 18 is also illustrative. The collector electrode 18 may have any shape that enables light to pass through.

According to the present invention, a power generation layer is arranged between a first electrode and a second electrode, at least one of the first and second electrodes is translucent, a first through-hole penetrating the first electrode is formed, a second through-hole which is different from the first through-hole in size and which penetrates the second electrode is formed at a position corresponding to the first through-hole, a periphery of the first or second through-hole is exposed without overlapping the power generation layer, a first electrode lead-out terminal is provided around the first through-hole to allow the first electrode to be led out, and a second electrode lead-out terminal is provided around the second through-hole to allow the second electrode to be led out in a direction identical to a direction in which the first electrode is led out. Thus, the first and second electrodes can be led out in the same direction utilizing the second through-hole, and the present invention can be applied to solar cells. In particular, the present invention allows unitary cells to be easily mounted and removed, replaced, and rearranged and is suitably applied to a power generation panel with a plurality of cells connected together therein and to a temporary solar power generator.

What is claimed is:

1. A solar cell comprising:
a power generation layer arranged between a first electrode and a second electrode, the first and second electrodes being stacked and at least one of the first and second electrodes being translucent, characterized in that:
a first through-hole penetrating through the first electrode is formed,
a second through-hole which is different from the first through-hole in size and which penetrates through the second electrode is formed at a position corresponding to the first through-hole such that the first through-hole and the second through-hole are at least partially aligned,
wherein an inner wall surface of the first electrode surrounds the first through-hole and an inner wall surface of the second electrode surrounds the second through-hole, and
a peripheral surface extending around a smaller one of the first or second through-holes is exposed through the other of the first and second through-holes without the power generation layer being exposed,
a first electrode lead-out terminal is provided around the first through-hole on the peripheral surface to allow the first electrode to be led out in a first direction through the first or second through-hole, and
a second electrode lead-out terminal is provided around the second through-hole to allow the second electrode to be led out in the first direction in which the first electrode is led out, such that both the first electrode and the second electrode are led out in the same direction wherein the power generation layer is a porous semiconductor layer contacting the first electrode, and wherein the power generation layer is a dye-sensitized photovoltaic power generation layer carrying a dye on a surface thereof.

2. The solar cell according to claim 1, characterized in that the first electrode is translucent and is formed on one principal surface of a translucent first substrate that comprises the first through-hole,
- the second electrode is formed on one principal surface of a second substrate that comprises the second through-hole,
- the second through-hole is larger than the first through-hole,
- the first through-hole comprises the peripheral surface and the peripheral surface of the first through-hole is exposed via alignment of the first and second through-holes without the power generation layer being exposed, and
- the second electrode lead-out terminal is formed on another principal surface of the second substrate and is connected to the second electrode through and along the inner wall surface of the second through-hole in the second substrate.

3. The solar cell according to claim 2, characterized in that the one principal surfaces of the first substrate and the second substrate each have an inner peripheral side adjacent to an inner edge of the inner wall surface of the respective first and second through-hole and an outer peripheral side adjacent to an outer edge of the respective first and second substrate,
- a first sealant is arranged between the first substrate and the second substrate on the respective one principal surface adjacent the outer edge along the outer peripheral side of each of the substrates and a second sealant is arranged between the one principal surface adjacent to the inner edge of the second through-hole along the inner peripheral side of the second substrate and the first electrode of the first substrate to thereby form a space between arrangements of the first and second sealants and the surfaces of the first and second substrates,
- an electrolyte is sealed in the space formed by the arrangements of the first and second sealants and the surfaces of the first and second substrates, and
- the power generation layer is a porous semiconductor layer contacting the first electrode in the space and carrying a dye on a surface thereof and is a dye-sensitized photovoltaic power generation layer.

4. The solar cell according to claim 3, characterized in that the second electrode lead-out terminal is a conductor thin film formed at least around the through-hole in the second substrate, at another principal surface side of the second substrate and connects to the second electrode via a conductor thin film covering the inner wall surface of the second through-hole in the second substrate.

5. The solar cell according to claim 3, characterized in that a. collector electrode is formed on the first electrode, and
- the collector electrode comprises:
- an annular portion formed on the peripheral surface of an exposed portion around the first through-hole and the first electrode lead-out terminal being conductively connected to the annular portion; and
- radial portions connected to the annular portion and formed to extend radially between the annular portion around the first through-hole and an outer edge of the first electrode.

6. The solar cell according to claim 1, wherein the second electrode lead-out terminal extends through and along the inner wall surface of the second through-hole.

7. The solar cell according to claim 2, wherein the second substrate has an outer edge, and wherein the second electrode is formed on the one principal surface of the second substrate except for an outer peripheral portion on the one principal surface that is adjacent the outer edge.

8. The solar cell according to claim 1, wherein the first through-hole and the second through-hole are formed substantially in a central portion of the respective first and second electrodes.

9. The solar cell according to claim 5, wherein the power generation layer is formed on the collector electrode.

* * * * *